United States Patent
Liu et al.

(10) Patent No.: US 10,283,564 B1
(45) Date of Patent: May 7, 2019

(54) SEMICONDUCTOR STRUCTURE AND THE METHOD OF MAKING THE SAME

(71) Applicant: UNITED MICROELECTRONICS CORP., Hsin-Chu (TW)

(72) Inventors: Chih-Chien Liu, Taipei (TW);
Chao-Ching Hsieh, Tainan (TW);
Yu-Ru Yang, Hsinchu County (TW);
Hsiao-Pang Chou, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/807,528

(22) Filed: Nov. 8, 2017

(30) Foreign Application Priority Data

Oct. 13, 2017 (CN) .......................... 2017 1 0953109

(51) Int. Cl.
| | |
|---|---|
| *H01L 27/24* | (2006.01) |
| *H01L 45/00* | (2006.01) |
| *H01L 21/02* | (2006.01) |
| *H01L 29/08* | (2006.01) |
| *H01L 21/265* | (2006.01) |

(52) U.S. Cl.
CPC .... *H01L 27/2436* (2013.01); *H01L 21/02532* (2013.01); *H01L 21/265* (2013.01); *H01L 27/2463* (2013.01); *H01L 29/0843* (2013.01); *H01L 45/1206* (2013.01); *H01L 45/1253* (2013.01); *H01L 45/145* (2013.01); *H01L 45/1675* (2013.01); *H01L 45/1608* (2013.01)

(58) Field of Classification Search
CPC ............. H01L 27/2436; H01L 29/0843; H01L 27/2463; H01L 45/1608
See application file for complete search history.

(56) References Cited

U.S. PATENT DOCUMENTS

| | | | |
|---|---|---|---|
| 9,023,699 B2 | 5/2015 | Chang | |
| 9,178,000 B1 | 11/2015 | Nardi | |
| 2011/0237043 A1* | 9/2011 | Kim | ................ H01L 27/10852 438/381 |
| 2017/0141300 A1* | 5/2017 | Trinh | ..................... H01L 45/08 |

* cited by examiner

*Primary Examiner* — Jay C Chang
*Assistant Examiner* — Mikka Liu
(74) *Attorney, Agent, or Firm* — Winston Hsu

(57) ABSTRACT

The present invention provides a semiconductor structure, the semiconductor structure includes a substrate comprising a diffusion region, a transistor structure on the substrate, and a resistive random access memory (RRAM) on the substrate, wherein the resistive random access memory includes at least one metal silicide layer in direct contact with the diffusion region, and a lower electrode, a resistive switching layer and an upper electrode are sequentially disposed on the metal silicide layer.

18 Claims, 5 Drawing Sheets

US 10,283,564 B1

SEMICONDUCTOR STRUCTURE AND THE METHOD OF MAKING THE SAME

BACKGROUND OF THE INVENTION

1. Field of the Invention

Embodiments of the invention generally relate to a semiconductor structure, and more particularly, to a transistor and a resistive random access memory (hereinafter abbreviated as RRAM) structure and the manufacturing method thereof.

2. Description of the Prior Art

Resistive random access memory (RRAM) has a simple structure, low operating voltage, high-speed, good endurance, and CMOS process compatibility. RRAM is the most promising alternative to provide a downsized replacement for traditional flash memory. RRAM is finding wide application in devices such as optical disks and non-volatile memory arrays.

An RRAM cell stores data within a layer of material that can be induced to undergo a phase change. The phase change can be induced within all or part of the layer to switch between a high resistance state and a low resistance state. The resistance state can be queried and interpreted as representing either a "0" or a "1". In a typical RRAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again.

SUMMARY OF THE INVENTION

The present invention provides a semiconductor structure, the semiconductor structure includes a substrate having a diffusion region therein, a transistor structure located on the substrate, and a resistive random access memory (RRAM) located on the substrate, wherein the resistive random access memory comprises at least one metal silicide layer, the metal silicide layer contacts the diffusion region directly, and a lower electrode, a resistive switching layer and a top electrode sequentially located on the metal silicide layer.

The present invention further provides a method for fabricating a semiconductor structure, the method includes: a substrate is provided, having a diffusion region disposed therein, a transistor structure is formed on the substrate, and a resistive random access memory (RRAM) is formed on the substrate, wherein the resistive random access memory comprises at least one metal silicide layer, the metal silicide layer contacts the diffusion region directly, and a lower electrode, a resistive conversion layer and a top electrode sequentially formed on the metal silicide layer.

One of the features of the present invention is that the high-k dielectric layer of the transistor and the resistive switching layer in the RRAM are formed by the same material layer in the same step during the manufacturing process. So the completed transistor's high-k dielectric layer and RRAM's resistance switching layer have the same material. The present invention saves process steps and integrates the RRAM process with the transistor process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
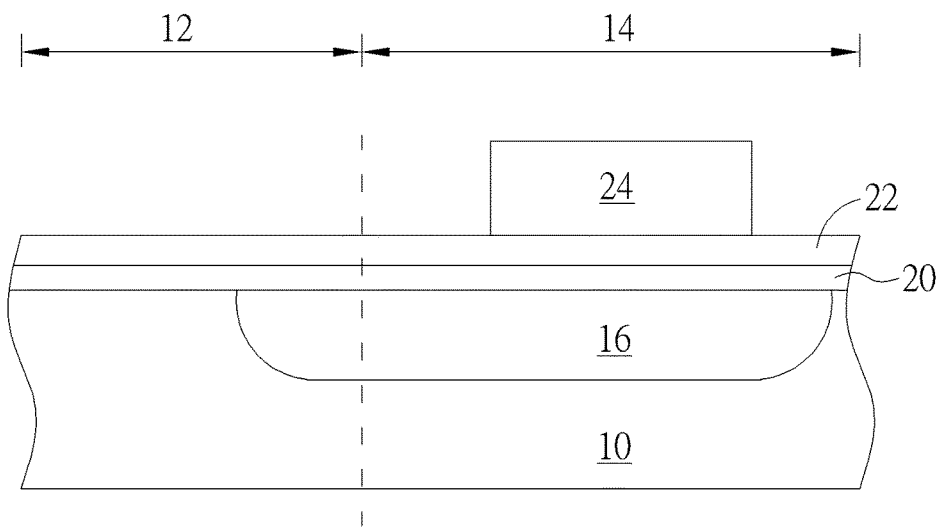
FIG. 1, FIG. 2, FIG. 3, FIG. 4 and FIG. 5 illustrate the schematic diagrams of the process for forming a semiconductor structure according to a first embodiment of the present invention.

Please refer to FIGS. 1, 2, 3, 4 and 5, these figures show the schematic diagrams for fabricating a semiconductor structure according to a first preferred embodiment of the present invention. Firstly, as shown in FIG. 1, a substrate 10 is provided, such as a silicon substrate. A transistor region 12 and a memory region 14 that disposed adjacent to the transistor region 12 are defined on the substrate 10. In the following steps, a transistor structure is predicted to be formed in the transistor region 12, and a resistive random access memory (RRAM) is formed in the memory region 14. A diffusion region 16 is formed in the substrate 10, such as an N-type diffusion region or a P-type diffusion region. The diffusion region 16 is located in the substrate 10 within the memory region 14 and in the substrate 10 within the transistor region 12 simultaneously. Next, a metal layer 20, a lower electrode material layer 22 and a patterned mask layer 24 are sequentially formed on the substrate 10. The metal layer 20 includes metal materials such as titanium or tantalum, the lower electrode material layer 22 includes such as a titanium nitride layer or tantalum nitride layer, and the patterned mask layer 24 defines the position of the RRAM that formed within the memory region 14 in the following steps.

Figure 2:
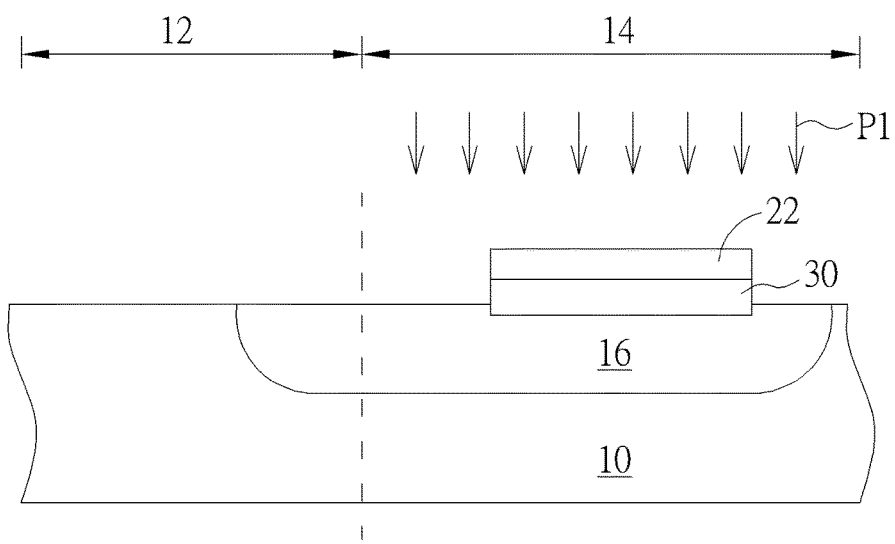

Next, please refer to FIG. 2, the patterned mask layer 24 is used as a protective layer, and an etching process is performed, to remove parts of the lower electrode material layer 22 and the metal layer 20 that not covered by the patterned mask layer 24. An annealing step P1 is then carried out to convert the metal layer 20 that directly contacting the substrate 10 into a metal silicide layer 30, so as to form the structure shown in FIG. 2. In addition, the metal silicide layer 30 contacts the diffusion region 16 directly. In the present embodiment, the metal silicide layer 30 and the lower electrode material layer 22 are formed by an etching process, so that the sidewall of the metal silicide layer 30 and the sidewall of the lower electrode material layer 22 are aligned with each other. The method and materials for forming each element described in FIG. 1 and FIG. 2 are well known to those skilled in the art, and thus are not described here.

Figure 2A:
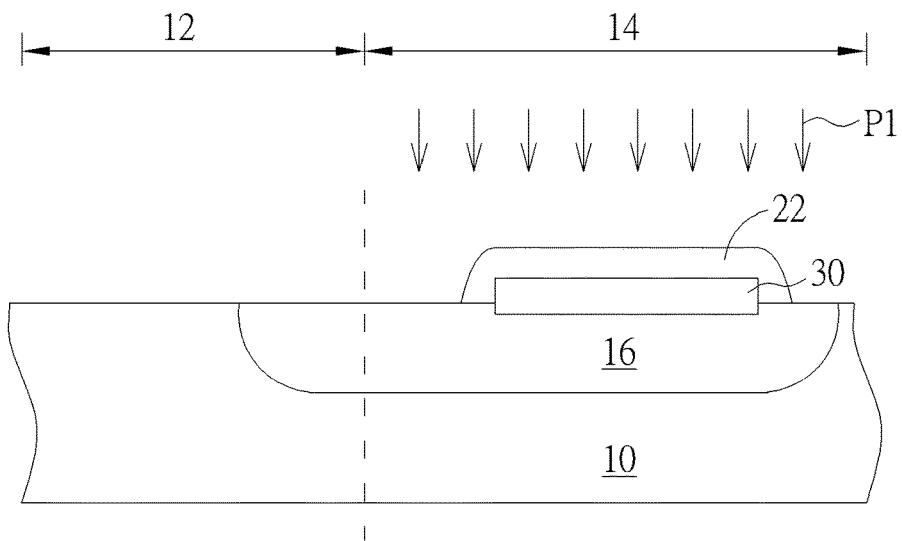
FIG. 2A illustrates the schematic diagram of a semiconductor structure according to another embodiment of the present invention.

In another embodiment of the present invention, please refer to FIG. 2A, before the metal silicide layer 30 is formed, the patterning process (such as the etching process) is performed through a self-aligned process. In other words, this process removes parts of the lower electrode material layer 22 and the metal layer 20 by a vertical etching process. Therefore, the patterned lower electrode material layer 22 may cover the sidewalls of the metal silicide layer 30, it is also within the scope of the present invention. However, the subsequent steps are continued with the structure shown in FIG. 2.

Figure 3:
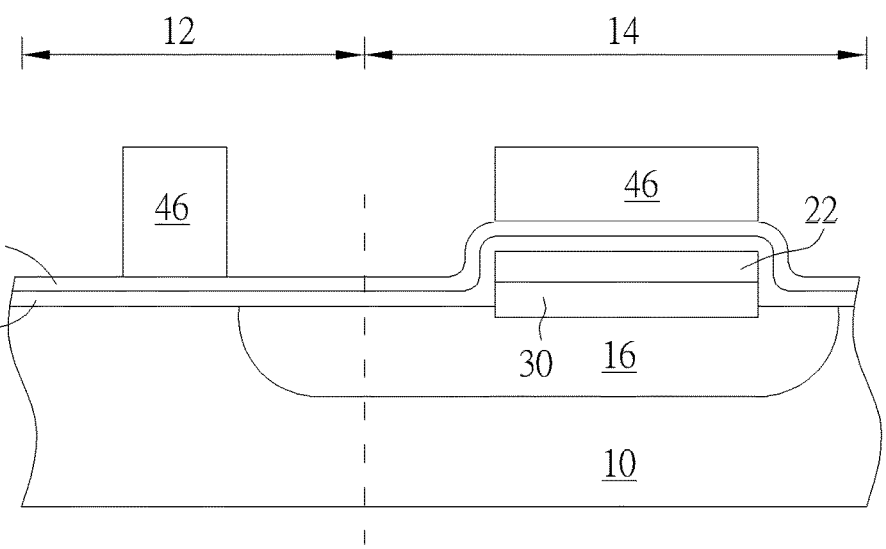

Next, as shown in FIG. 3, a high-k dielectric layer 42, a metal layer 44 and a patterned mask layer 46 are sequentially formed in the transistor region 12 and the memory region 14. The high-k dielectric layer 42 comprises such a dielectric material layer having a dielectric constant (k value) larger than 4 such as metallic oxide, hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta2O_9$, SBT), lead zirconate titanate ($PbZrxTi_{1-x}O_3$, PZT), barium strontium titanate ($BaxSr_{1-x}TiO_3$, BST) or a combination thereof. One feature of the present invention is that the high-k dielectric layer 42 is located not only on the substrate 10 within the transistor region 12, but also on the lower electrode material layer 22 within the memory region 14. Therefore, in the following steps, the high-k dielectric layer 42 can be used not only as a high-k dielectric layer in the transistor, but also used as a resistance switching layer in a RRAM structure (typically, a RRAM includes at least one lower electrode, a resistance switching layer and upper electrode). In other words, it is not necessary to form a resistive switching layer of RRAM by other processes, it can simplify overall process steps.

The material of the metal layer 44 mentioned above includes such as a titanium nitride layer, a tantalum nitride layer or other suitable materials, but the present invention is not limited thereto. The metal layer 44 located within the transistor region 12 covers on the high-k dielectric layer 42, the metal layer 44 can be used as a bottom barrier layer of the transistor, and a portion of the metal layer 44 that covers the high-k dielectric constant layer 42 (the high-k dielectric layer 42 is also the resistive switching layer of the RRAM) within the memory region 14 can be used as the upper electrode of the RRAM. The patterned mask layer 46 defines the position of the following-formed transistor gate and the position of the RRAM.

Figure 4:
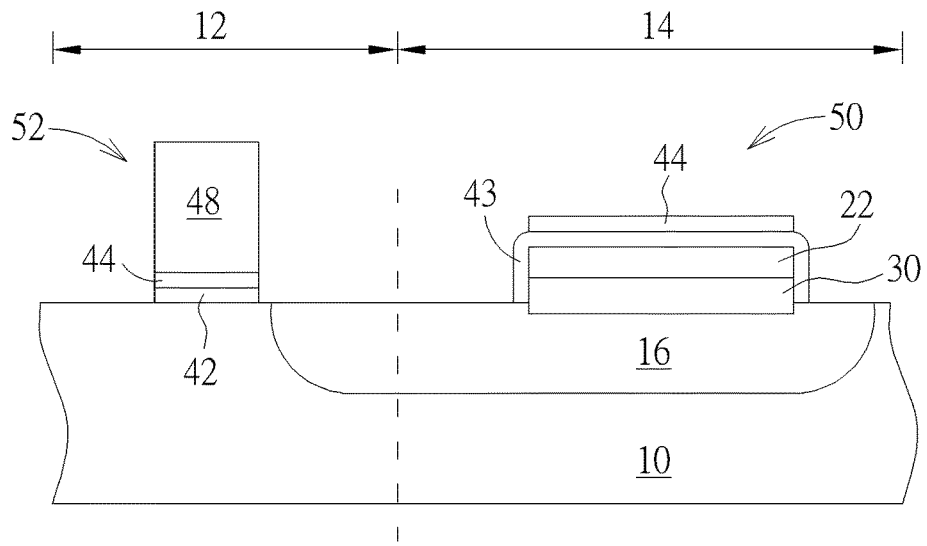

Next, as shown in FIG. 4, an etching step is performed, to remove parts of the metal layer 44 and the high-k dielectric layer 42, and to define the pattern of the RRAM 50 in the memory region 14. At this step, the remaining high-k dielectric layer is defined as the resistance switching layer 43. According to different embodiments, the resistance switching layer 43 may has a flat cross-section structure or a reverse U-shaped cross-section structure. In addition, the remaining patterned mask layer 46 is subsequently removed and a gate material layer 48 is formed at the top portion of the metal layer 44 within the transistor region 12. The gate material layer 48 includes such as a polysilicon layer, but is not limited thereto. The high-k dielectric layer 42, the metal layer 44 and the gate material layer 48 constitute a gate structure 52. It is noteworthy that in the conventional process, the RRAM is usually formed on a contact structure, but in the present invention, the RRAM 50 is formed on the surface of the substrate 10, and directly contacts the diffusion region 16.

Figure 5:
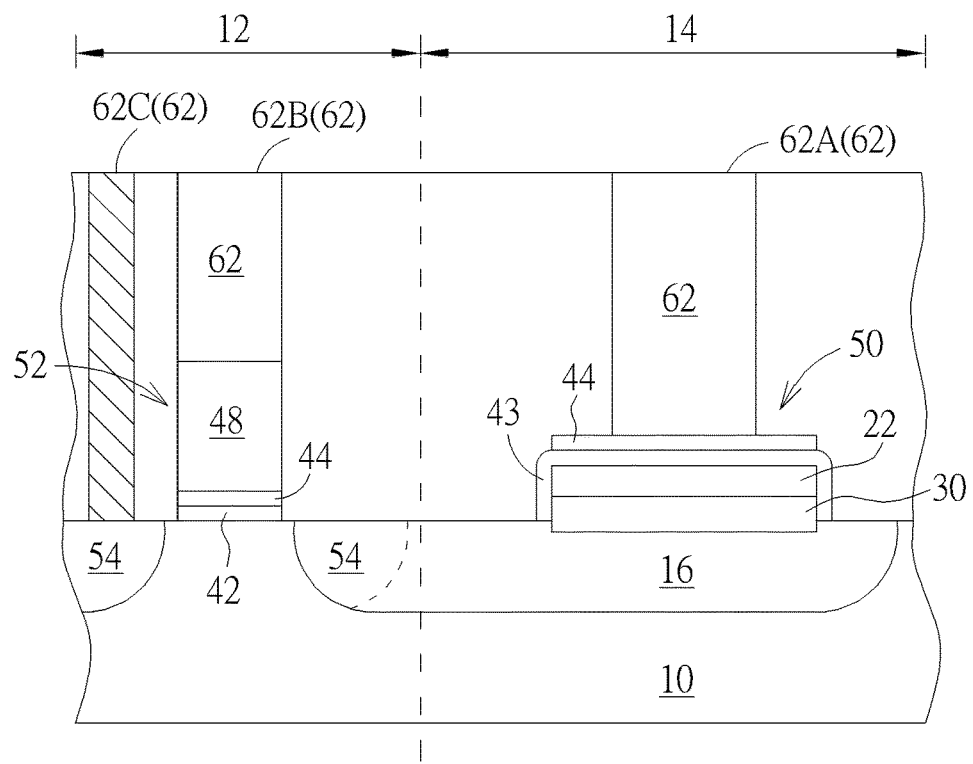

As shown in FIG. 5, after the gate structure 52 and the RRAM 50 are completed, an ion implantation process is performed in the substrate 10 around the gate structure 52, to form source/drain regions 54 in the substrate 10 on both sides of the gate structure 52. It is noteworthy that one side of the source/drain regions 54 overlaps the diffusion region 16 directly. That is, as shown in FIG. 5, one of the source/drain regions 54 contacts the diffusion region 16 directly, but the concentrations of the implanted ions of the source/drain region 54 and the diffusion region 16 may be different. It is to be noted that in other embodiments of the present invention, the source/drain regions 54 may also be directly formed in the substrate 10 after the diffusion region 16 is completed, it is also be within the scope of the present invention.

In the following steps, please still refer to FIG. 5, a dielectric layer 60 is formed on the substrate 10, and a plurality of contact structures 62 are formed in the dielectric layer 60, the contact structures 62 electrically connecting the RRAM 50, the gate structure 52 and the source/drain region 54. The material of the dielectric layer 60 includes such as silicon oxide or silicon nitride, and the material of the contact structure 62 includes materials having good conductivity, such as tungsten, etc., but the present invention is not limited thereto. Depending on the position of the contact structure 62, the contact structure 62 may be used as a selection line of a semiconductor device (e.g., the contact structure 62A in FIG. 5), a word line (e.g., the contact structure 62B in FIG. 5) of a semiconductor device, or a bit line (e.g., the contact structure 62C in FIG. 5) of a semiconductor device. At this step, the semiconductor structure that integrating the transistor and the RRAM has been completed.

The following description will detail the different embodiments of the semiconductor structure and the manufacturing method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
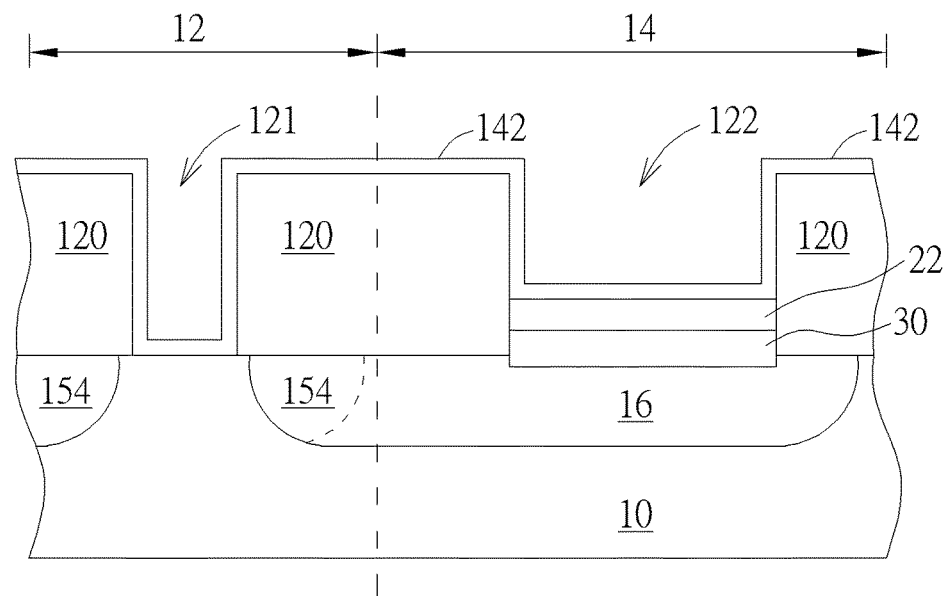
FIG. 6, FIG. 7 and FIG. 8 illustrate the schematic diagrams of the process for forming a semiconductor structure according to a second embodiment of the present invention.
Figure 7:
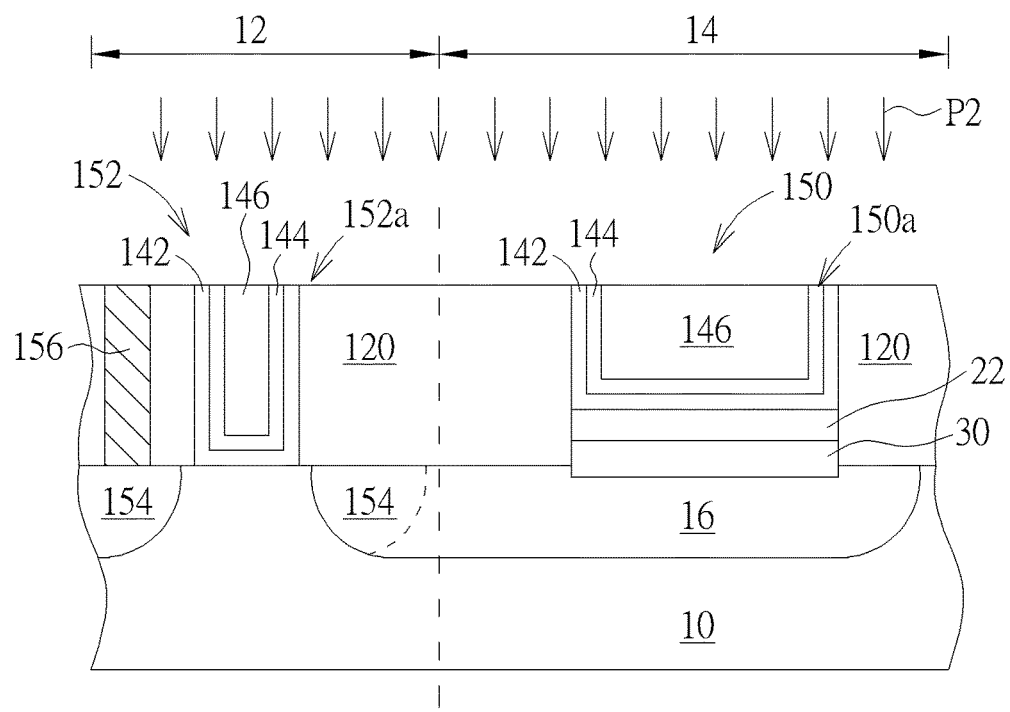
Figure 8:
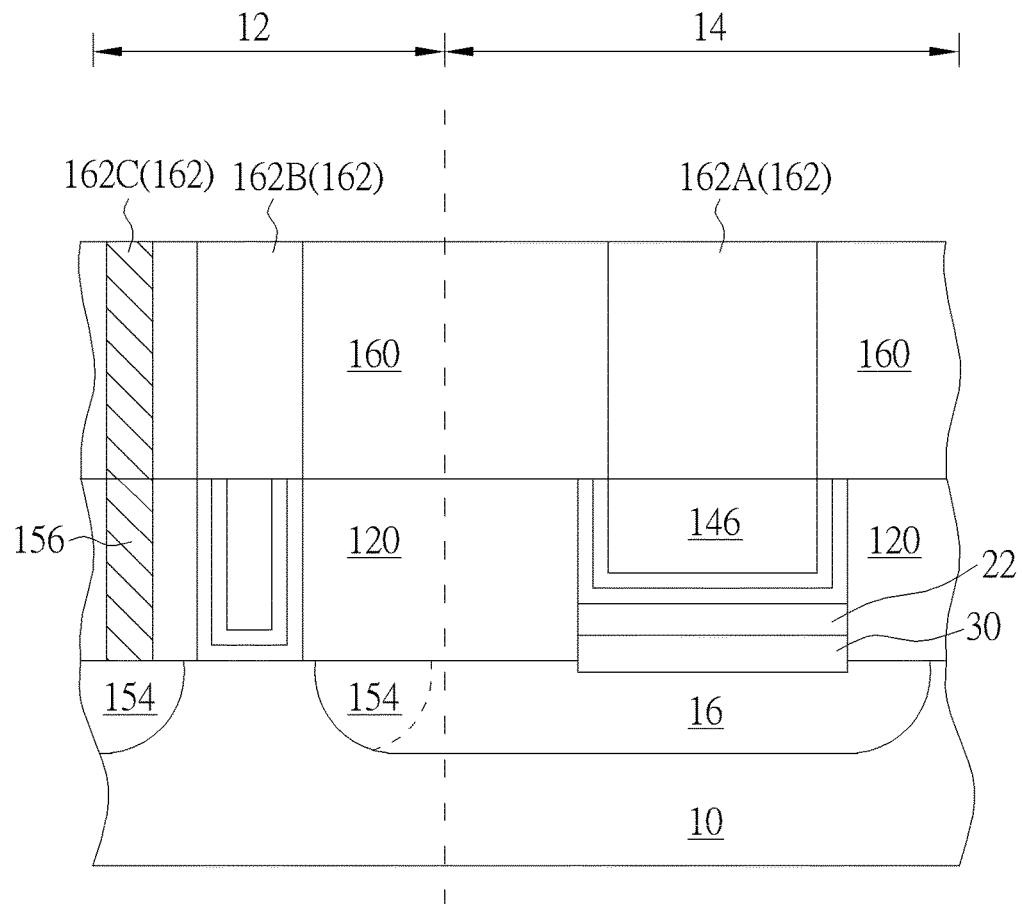

Please refer to FIG. 6, FIG. 7 and FIG. 8, these figures show the schematic diagrams for fabricating a semiconductor structure according to a second preferred embodiment of the present invention. In the second embodiment of the present invention, as shown in FIG. 6, the substrate 10 is first provided, a transistor region 12 and a memory region 14 are defined on the substrate 10, and a diffusion region 16 is formed in the substrate 10. Next, a patterned metal silicide layer 30 and a lower electrode material layer 22 are formed in the memory region 14. Until this step, the process is same as that shown in FIG. 2 of the first preferred embodiment. Therefore, the manufacturing method and material properties of each element is not repeated. The difference between this embodiment and the first preferred embodiment is that after the metal silicide layer 30 and the lower electrode material layer 22 are formed, in the embodiment, a dummy gate (not shown) comprising a dielectric layer and a polysilicon material is then formed in the transistor region 12 and the memory region 14, a contact etching stop layer (not shown) is formed to cover the dummy gate, and a dielectric layer 120 comprising tetraethyl orthosilicate (TEOS) is formed on the contact etching stop layer. Thereafter, a replacement process can be performed. More precisely, parts of the dielectric layer 120 and the contact etching stop layer are planarized, and a selective dry etching or wet etching process is performed, such as using the ammonia solution ($NH_4OH$) or the tetramethylammonium hydroxide (TMAH) to remove the polysilicon material in each dummy gate, so that a first opening 121 and a second opening 122 are formed in the dielectric layer 120. The first opening 121 is located within the transistor region 12, exposes a portion of the substrate 10, the second opening 122 is located within the memory region 14, exposes the lower electrode material layer 22. Preferably, the size of the second opening 122 is same as the size of the lower electrode material layer 22. More specifically, the position of the first opening 121 defines the position of the following-formed transistor, and the position of the second opening 122 defines the position of the RRAM. In other words, other material layers formed in the following steps will be formed in the first opening 121 and the second opening 122.

In addition, in the present embodiment, since the dielectric layer 120 is firstly formed on the substrate 10, it is preferable that the source/drain region 154 has been formed in the substrate before the dielectric layer 120 is formed, to prevent the source/drain region 154 cannot be formed in the substrate 10 easily after the dielectric layer 120 is formed. Next, a high-k dielectric layer 142 is formed, the high-k dielectric layer 142 is filled into the first opening 121 and the second opening 122 respectively. The high-k dielectric layer 142 comprises the same material as that of the high-k dielectric layer 42 mentioned above, including a dielectric material layer having a dielectric constant (k value) larger than 4, such as metallic oxide, hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta2O_9$, SBT), lead zirconate titanate ($PbZrxTi_1-xO_3$, PZT), barium strontium titanate ($BaxSr_1-xTiO_3$, BST) or a combination thereof. The present embodiment is characterized in that the high-k dielectric layer 142 is not only used as a high-k dielectric layer of the transistor, but also be used as a resistance switching layer of the RRAM. So the process steps can be simplified, the process for forming the RRAM can be integrated in the process for forming the transistor.

In addition, in the above embodiment, the flat metal silicide layer 30 and the lower electrode material layer 22 are formed firstly, and the dielectric layer 120 is then formed. However, in other embodiments of the present invention, the metal silicide layer 30 and the lower electrode material layer 22 may be formed in the opening of the dielectric layer 120 after the dielectric layer 120 is formed. In this case, the lower electrode material layer 22 may has an U-shaped cross section structure. This embodiment is also within the scope of the present invention.

As shown in FIG. 7, a metal layer 144 and a conductive layer 146 are sequentially formed to fill the first opening 121 and the second opening 122. A planarization step P2 is then performed to remove the extra conductive layer 146, the metal layer 144, and the high-k dielectric layer 142 on the surface of the dielectric layer 120 respectively, and form the RRAM 150 and the gate structure 152 respectively. The high-k dielectric layer remaining in the memory region 14 is defined as the resistance switching layer 143, and the resistance switching layer 143 has an U-shaped cross-sectional structure. It is to be noted that a top surface 150a of the RRAM 150 and a top surface 152a of the gate structure 152 are on a same level. In addition, at least one contact structure 156 is formed in the dielectric layer 120, and the contact structure 156 is electrically connected to the source/drain region 154.

Finally, as shown in FIG. 8, a dielectric layer 160 is formed on the dielectric layer 120, and a plurality of contact structures 162 are formed in the dielectric layer 160. The contact structures 162 electrically connect the RRAM 150, the gate structure 152 and the contact structures 156 described above. Depending on the position of the contact structure 162, the contact structure 162 may be used as a selection line (e.g., the contact structure 162A in FIG. 8) of the semiconductor device, a word line (e.g., the contact structure 162B in FIG. 8) of the semiconductor device, or a bit line (e.g., the contact structure 162C in FIG. 8.) of the semiconductor device. At this step, the semiconductor structure in which the present invention integrates the transistor and the RRAM has been completed.

In the semiconductor structure of the present invention, please refer to FIG. 5, the semiconductor structure formed on the substrate 10, the semiconductor structure includes the diffusion region 16 located in the substrate 10, the transistor 52 located on the substrate 10, and the resistive random access memory (RRAM) 50 located on the substrate 10. The RRAM 50 comprises a metal silicide layer 30 contacting the diffusion region 16 directly. And a lower electrode 22, a resistive switching layer 43 and an upper electrode 44 are sequentially located on the metal silicide layer 30. In other embodiments, please refer to FIG. 8, since partial material layers are formed in the opening, the resistance switching layer 143 has an U-shaped cross section structure. One of the features of the present invention is that the high-k dielectric layer of the transistor and the resistive switching layer in the RRAM are formed by the same material layer in the same step during the manufacturing process. So the completed transistor's high-k dielectric layer and RRAM's resistance switching layer have the same material. The present invention saves process steps and integrates the RRAM process with the transistor process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
a substrate having a diffusion region therein;
a transistor structure located on the substrate; and
a resistive random access memory (RRAM) located on the substrate, wherein the resistive random access memory comprises at least one metal silicide layer contacting the diffusion region directly, and a lower electrode, a resistive switching layer and a top electrode sequentially located on the metal silicide layer, wherein a sidewall of the lower electrode layer is aligned with a sidewall of the metal silicide layer.

2. The semiconductor structure of claim 1, wherein the transistor structure comprises a gate structure, the gate structure comprises a high-k dielectric layer, wherein a material of the high-k dielectric layer is same as a material of the resistive switching layer.

3. The semiconductor structure of claim 2, wherein a top surface of the gate structure and a top surface of the resistive random access memory are on a same level.

4. The semiconductor structure of claim 1, wherein the resistance switching layer has an U-shaped cross section profile.

5. The semiconductor structure of claim 1, wherein the resistance switching layer has a reverse U-shaped cross section profile.

6. The semiconductor structure of claim 1, wherein the transistor structure comprises a source/drain (S/D) region located in the substrate, wherein the source/drain region contacts the diffusion region directly.

7. The semiconductor structure of claim 1, wherein the lower electrode layer covers one sidewall of the metal silicide layer.

8. The semiconductor structure of claim 1, wherein a material of the lower electrode comprises titanium nitride.

9. The semiconductor structure of claim 1, further comprises a plurality of contact structures, electrically connected to the resistive random access memory and the transistor structure respectively.

10. A method for fabricating a semiconductor structure, comprising:
   providing a substrate having a diffusion region disposed therein;
   forming a transistor structure on the substrate; and
   forming a resistive random access memory (RRAM) on the substrate, wherein the resistive random access memory comprises at least one metal silicide layer contacting the diffusion region directly, and a lower electrode, a resistive switching layer and a top electrode sequentially formed on the metal silicide layer, a sidewall of the lower electrode layer is aligned with a sidewall of the metal silicide layer.

11. The method of claim 10, wherein the transistor structure comprises a gate structure, the gate structure comprises a high-k dielectric layer, wherein a material of the high-k dielectric layer is same as a material of the resistive switching layer.

12. The method of claim 11, wherein the step of forming the high-k dielectric layer and the resistance switching layer comprises:
   forming the metal silicide layer and the lower electrode on the substrate;
   forming a dielectric material layer on the substrate, wherein parts of the dielectric material layer is disposed on the lower electrode; and
   performing an etching step to remove a portion of the dielectric material layer, and to form the high-k dielectric layer on the substrate and to form the resistance switching layer on the lower electrode simultaneously.

13. The method of claim 11, wherein a top surface of the gate structure and a top surface of the resistive random access memory are on a same level.

14. The method of claim 10, wherein the resistance switching layer has an U-shaped cross section profile.

15. The method of claim 10, wherein the resistance switching layer has a reverse U-shaped cross section profile.

16. The method of claim 10, wherein the transistor structure comprises a source/drain (S/D) region located in the substrate, wherein the source/drain region contacts the diffusion region directly.

17. The method of claim 10, wherein the lower electrode layer covers one sidewall of the metal silicide layer.

18. The method of claim 10, further comprises forming a plurality of contact structures, electrically connected to the resistive random access memory and the transistor structure respectively.

* * * * *